United States Patent
Hayne et al.

(10) Patent No.: US 10,938,178 B2
(45) Date of Patent: Mar. 2, 2021

(54) VERTICAL-CAVITY SURFACE-EMITTING LASER

(71) Applicant: Lancaster University Business Enterprises Limited, Lancaster (GB)

(72) Inventors: Manus Hayne, Lancashire (GB); Peter David Hodgson, Lancashire (GB)

(73) Assignee: Lancaster University Business Enterprises Limited, Lancaster (GB)

( * ) Notice: Subject to any disclaimer, the term of this patent is extended or adjusted under 35 U.S.C. 154(b) by 0 days.

(21) Appl. No.: 15/552,746

(22) PCT Filed: Mar. 2, 2016

(86) PCT No.: PCT/GB2016/050550
§ 371 (c)(1),
(2) Date: Aug. 22, 2017

(87) PCT Pub. No.: WO2016/139473
PCT Pub. Date: Sep. 9, 2016

(65) Prior Publication Data
US 2018/0054041 A1  Feb. 22, 2018

(30) Foreign Application Priority Data
Mar. 2, 2015 (GB) ..................... 1503498

(51) Int. Cl.
| H01S 5/34 | (2006.01) |
| H01S 5/183 | (2006.01) |
| H01S 5/343 | (2006.01) |
| B82Y 20/00 | (2011.01) |

(52) U.S. Cl.
CPC .......... *H01S 5/18361* (2013.01); *B82Y 20/00* (2013.01); *H01S 5/183* (2013.01); *H01S 5/341* (2013.01); *H01S 5/3412* (2013.01); *H01S 5/3422* (2013.01); *H01S 5/34306* (2013.01)

(58) Field of Classification Search
CPC .... H01S 5/3422; H01S 5/341; H01S 5/34306; H01S 5/18–187
See application file for complete search history.

(56) References Cited

U.S. PATENT DOCUMENTS

| 5,805,624 A | 9/1998 | Yang et al. | |
| 2002/0176474 A1* | 11/2002 | Huang | B82Y 10/00 372/96 |

(Continued)

OTHER PUBLICATIONS

Patane et al. ("Thermal effects in quantum dot lasers"; J. of Applied Physics, vol. 85, No. 1, Jan. 1, 1999) (Year: 1999).*

(Continued)

*Primary Examiner* — Tod T Van Roy
(74) *Attorney, Agent, or Firm* — Young Basile Hanlon & MacFarlane, P.C.

(57) ABSTRACT

A vertical-cavity surface-emitting laser ("VCSEL") has at least a substrate, electrical contacts, a first mirror region, a second mirror region and an active region between the mirror regions; where the mirror regions comprise distributed Bragg reflectors formed of a plurality of layers; laser emission is from at least one gallium arsenide antimonide nanostructure in the active region; and each said nanostructure contains more antimony atoms than arsenic atoms.

10 Claims, 5 Drawing Sheets

(56) References Cited

U.S. PATENT DOCUMENTS

2003/0231680 A1    12/2003  Burak
2005/0031011 A1*  2/2005  Biard .................. H01S 5/18358
                                                        372/99

OTHER PUBLICATIONS

Lin et al., "Improved 1.3-μm Electroluminescence of InGaAs-Capped Type-II GaSb/GaAs Quantum Rings at Room Temperature", IEEE Photonics Technology Letters, vol. 25, No. 1, Jan. 1, 2013, pp. 97-99.

Lin et al., "Room-Temperature Electro-Luminescence of Type-II GaSb/GaAs Quantum Rings", IEEE Photonics Technology Letters, vol. 24, No. 14, Jul. 15, 2012, pp. 1203-1205.

Yamamoto et al., "Sb-based quantum dots for creating novel light-emitting devices for optical communications", Nanophotonics for Communication: Materials, Devices, and Systems III, Proc. of SPIE vol. 6393, (2006), 63930A-1 through 63930A-10.

Zhang et al., "Controlled optical properties of GaSb/InGaAs type-II quantum dots grown on InP substrate", Applied Physics Letters 100, (2012), 251908-1 through 251908-4.

* cited by examiner

Prior Art

VERTICAL-CAVITY SURFACE-EMITTING LASER

CROSS REFERENCE TO RELATED APPLICATION

The present application claims priority to Great Britain Patent Application No. 1503498.6, filed Mar. 2, 2015, incorporated herein in its entirety.

TECHNICAL FIELD

The design of the device known as a vertical-cavity surface-emitting laser ("VCSEL") has been known for some time. A VCSEL is a solid state semiconductor device generally comprising a substrate, a first mirror region, a second mirror region and an active region between the mirror regions. Each mirror region generally comprises a distributed Bragg reflector ("DBR") formed of a plurality of thin layers of suitable materials.

BACKGROUND

VCSELs offer advantages over traditional edge-emitting lasers, such as: high frequency operation (switching speeds), simple compact device packaging, extremely low threshold, low power consumption, circular beam profiles and low beam divergence.

The properties of VCSELs make them advantageous for use in telecommunications. An industry goal is to produce bright efficient VCSELs with no need for cooling and with emission at wavelengths in the range from 1260 to 1675 nm (where optical fibre has low attenuation). This is not easily achieved using the traditionally preferred gallium arsenide based material system.

Some VCSELs operating between 1260 to 1675 nm have been reported. These are quantum well VCSELs comprising highly strained materials. Examples include indium gallium arsenide with gallium arsenide; or gallium indium nitride arsenide or gallium indium nitride arsenide antimonide with gallium arsenide; or indium aluminium gallium arsenide phosphide with indium phosphide. However, such devices have disadvantages that prevent their widespread industrial application.

Disadvantages of the indium phosphide design include a lack of suitable DBR materials able to provide high thermal conductivity and reflectivity. Indium phosphide devices are therefore extremely sensitive to temperature changes and lateral mode confinement is difficult.

Gallium arsenide based devices suffer from different disadvantages. Such devices may take advantage of lattice matched, high reflectivity, high thermal conductivity DBRs comprising aluminium gallium arsenide with gallium arsenide. However, it is difficult to achieve long wavelength (longer than one micron) emission in gallium arsenide based devices. It is known to attempt this by incorporation of strained quantum well layers or dilute nitrides (e.g., U.S. Pat. No. 5,805,624A); however such techniques reduce material quality and negatively impact device performance.

It is an objective of the present invention to mitigate and/or overcome disadvantages of existing VCSEL devices, whether or not stated explicitly here. It is a further objective to provide VCSELs suitable for industrial use in fibre optic networks and in other applications.

SUMMARY

The present invention is a vertical-cavity surface-emitting laser ("VCSEL") comprising at least a substrate, electrical contacts, a first mirror region, a second mirror region and an active region between the mirror regions, where the mirror regions comprise distributed Bragg reflectors formed of a plurality of layers; laser emission is from at least one gallium arsenide antimonide nanostructure in the active region, and each said nanostructure contains more antimony atoms than arsenic atoms.

Each nanostructure may comprise a quantum ring. Each quantum ring may be located within a quantum well. Each quantum well may be provided by a first additional layer between the active region and the first mirror region and a second additional layer between the active region and the second mirror region.

The said additional layers may comprise aluminium gallium arsenide, and may further comprise a composition gradient of gallium and aluminium. This composition gradient may be substantially linear. Within the said additional layers the group III atomic fraction of aluminium may increase from a low value at the side nearer to the active region, to a high value at the side further from the active region. The low value may be between 0.25 and 0.35 and the said high value may be between 0.55 and 0.65. The low value may be 0.3 and the high value may be 0.6.

The VCSEL may generate laser emission with a wavelength within the range 1260 to 1675 nm. It may do this without the need for active cooling.

The Oxford English Dictionary ("OED") defines nanostructure as "A structure, esp. a semiconductor device, that has dimensions of a few nanometres" (entry dated 2012). Skilled persons working in the field of the invention consider that only structures with two or more dimensions smaller than 100 nanometres are nanostructures.

A quantum well is nanoscale-thin in one dimension, but the two in-plane dimensions are determined by the lateral size of the device. Known VCSEL devices have such dimensions in excess of 100 nanometres and typically several microns. For example, the VCSEL of US2003/0231680 whose active region has at least one quantum well, does not incorporate a nanostructure (under the definition above).

To the skilled person, the choice of gallium antimonide for use in the active region will seem unintuitive and unlikely to succeed. Gallium antimonide and gallium arsenide have type-II band alignment, which confines positive charge in the gallium antimonide and repels negative charge. This would be expected to reduce charge carrier recombination and hence lower emission intensity.

However, the inventors have realised that counter-intuitively (and even at elevated temperatures) VCSELs may be made such that positive charge may accumulate in the ~600 meV deep confining potential provided by the gallium antimonide. This may attract negative charge and allow elevated levels of charge carrier recombination.

The use of quantum rings ("QR") rather than traditional quantum dots may relax the strain from the incorporation of gallium antimonide into gallium arsenide, reducing the number of defects (dislocations) in the material.

Embodiments of the invention will now be described by way of example only, with reference to the accompanying drawings, in which

DETAILED DESCRIPTION OF THE EMBODIMENTS

Figure 1:
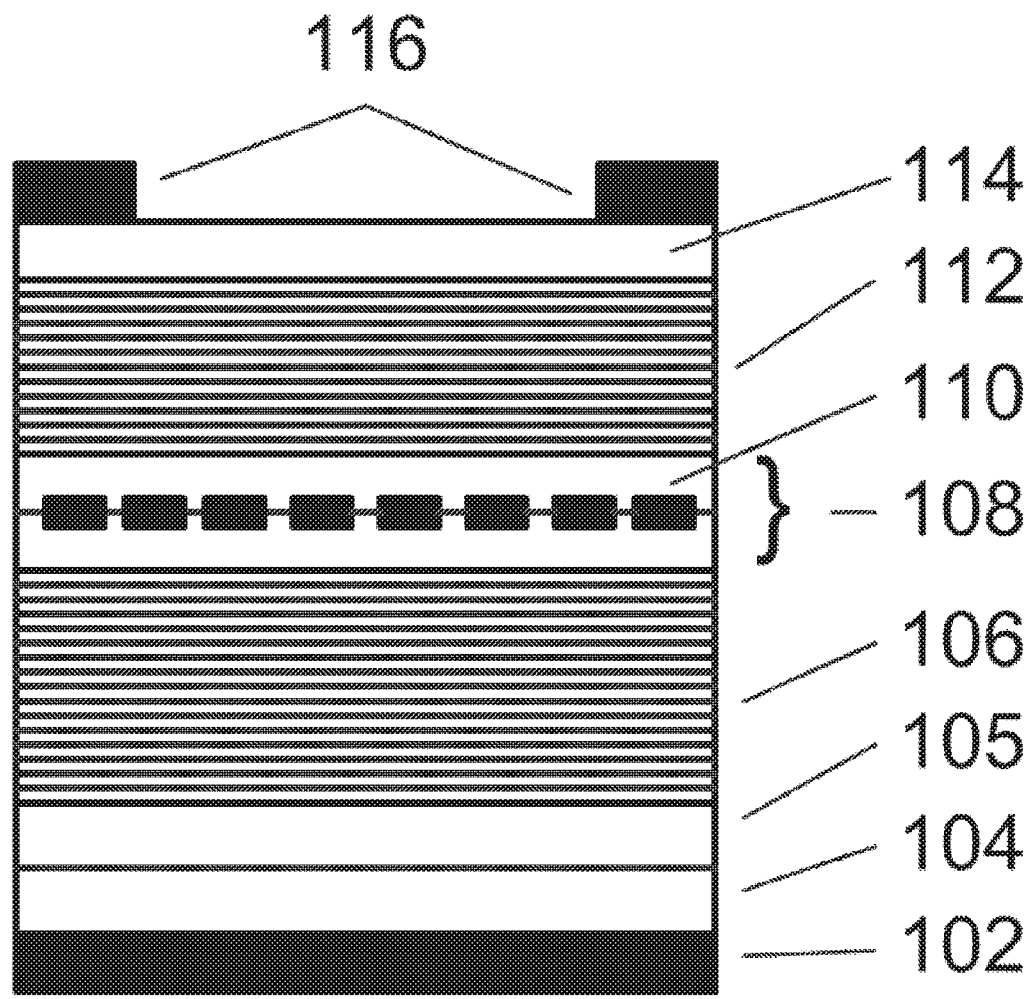
FIG. 1 is a schematic cross sectional view of an embodiment of a generic VCSEL (prior art); not to scale.

FIG. 1 is a schematic cross sectional view of an embodiment of a generic VCSEL (prior art); not to scale. This device comprises a substrate (104) with lower electrical contact(s) (102). On the other (upper) side of the substrate (104) is an optional buffer layer (105) and a first mirror region (106), which comprises a DBR formed of a plurality of layers. Then follows the active region (108) within which the active laser structures (110) are formed. Next there is a second mirror region (112) which is a DBR comprising a plurality of layers, a further optional buffer layer (114) and upper electrical contact(s) (116). In use, laser light is emitted from the top surface of the device. The upper contact(s) (116) may preferably be in the form of a ring to allow emission of a circular beam, but may take other suitable forms.

A voltage is applied between the top contact(s) (116) and bottom contact(s) (102) to provide the electrical current which powers the device and causes light emission.

Figure 2:
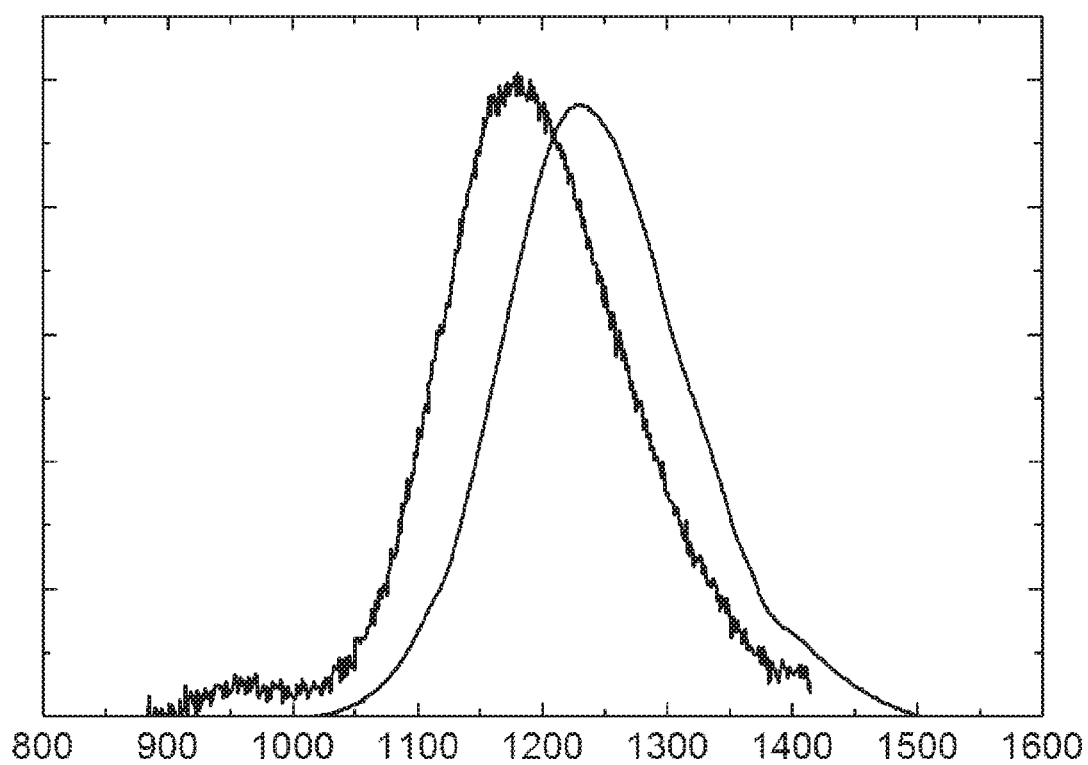
FIG. 2 shows photoluminescence spectra from gallium antimonide QRs.

FIG. 2 shows photoluminescence spectra from an ensemble of gallium antimonide QRs. The x-axis shows the emitted wavelength in nanometres. The y-axis represents intensity in arbitrary units. The (left hand) plot with the shorter wavelength peak was measured at 400 K and the other (right hand) plot at 300 K. This indicates that QR VCSELs according to the present invention may operate at high temperatures with reduced or no need for cooling.

Figure 3A:
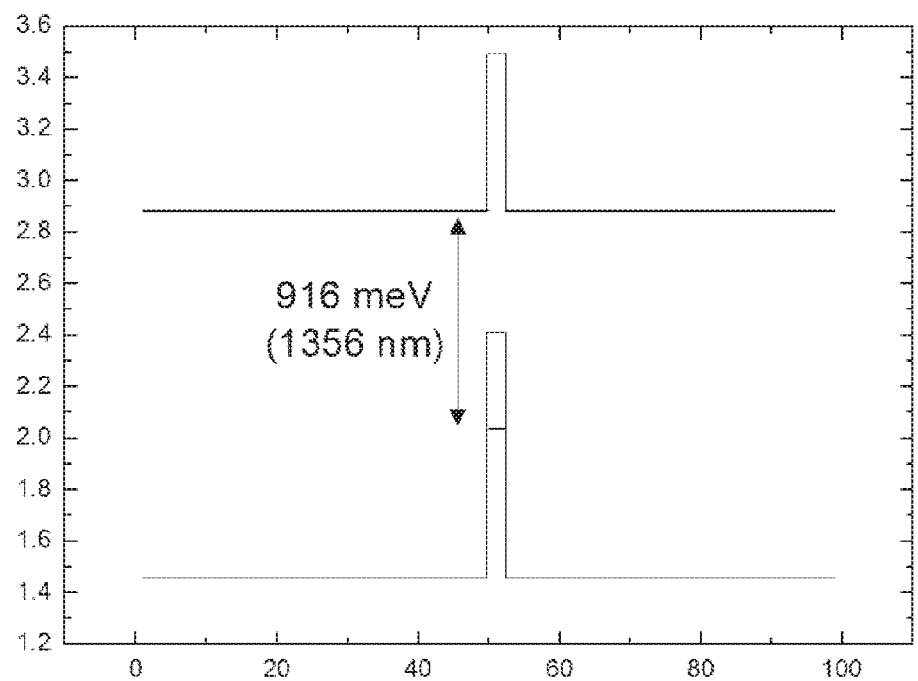
FIGS. 3A and 3B show schematically the band structure of a gallium antimonide QR alone; and the same within a 20 nm aluminium gallium arsenide quantum well.
Figure 3B:
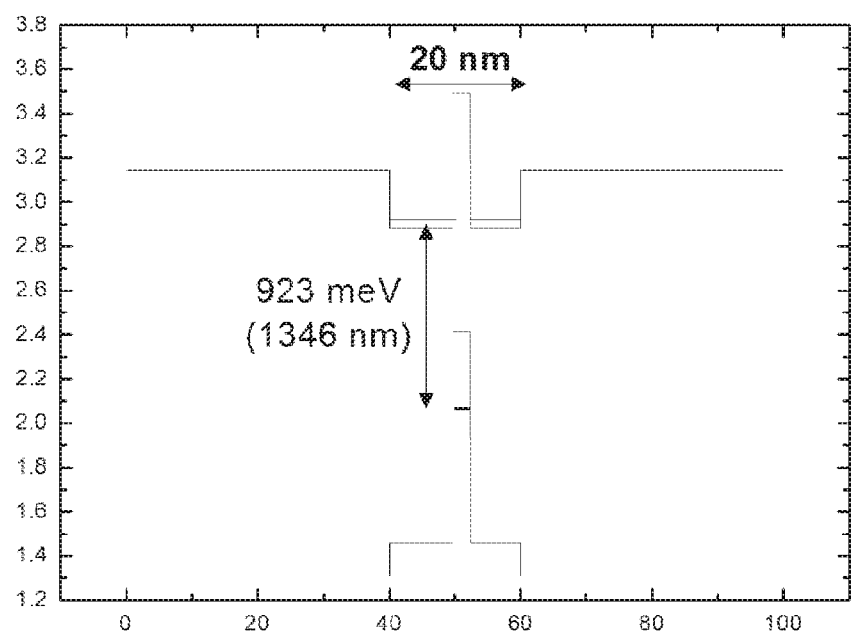

FIG. 3A and FIG. 3B are bandgap diagrams. In each case the y-axis represents energy in electron-volts and the x-axis represents displacement in nanometres. Ground state recombination energies are shown by the vertical arrows and the respective energies and wavelengths are given.

FIG. 3A shows the gallium antimonide gallium arsenide bandgap diagram, without a quantum well. FIG. 3B shows the equivalent bandgap diagram with the addition of a 20 nanometer width aluminium gallium arsenide quantum well.

Quantum rings may be formed by depositing gallium antimonide onto a gallium arsenide surface. Because of the lattice mismatch, highly strained quantum dots first self-assemble, by the Stanski-Krastanov growth mode. The exact dimensions may depend on growth conditions, but such dots may typically have radii of about 30 nm and height of about 4 nm. When the dots are covered ("capped") by deposition of gallium arsenide, the dots transform into rings. Rings form when the antimony atoms in the centre of the dots are replaced by arsenic atoms, reducing the overall structural strain. Rings typically have inner radii of the order of 15 nm.

Figure 4:
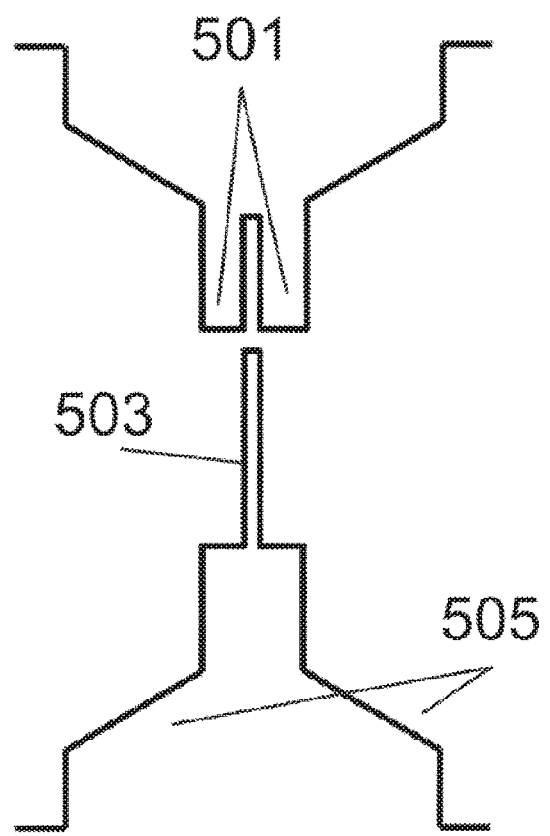
FIG. 4 shows schematically the bandgap structure of the active region in an embodiment of the present invention.

The emission intensity of devices according to the present invention may be improved by locating each gallium antimonide quantum ring within a quantum well in the active region (108). The quantum well increases the electron confinement, forcing electrons closer to the quantum rings FIG. 4 shows a schematic diagram of the bandgap in the active region of the device. The y-axis represents energy and the x-axis represents the vertical direction through the device.

FIG. 4 shows the regions (501) where electrons are confined within the gallium arsenide quantum well, and the region (503) where holes are confined in the gallium antimonide quantum ring. The sloped band-edges (505) are engineered by providing a composition gradient within aluminium gallium arsenide layers (107, 111). This aspect of the structure is present in order to channel charge carriers to the active region. The composition gradient is known from the art, for example U.S. Pat. No. 7,065,124.

Calculations indicate that a 20 nanometer wide quantum well may increase the laser emission intensity by up to 3 orders of magnitude, with a shift in the emission wavelength of only about 10 nanometres. Other widths of quantum well may be applied in other embodiments.

Figure 5:
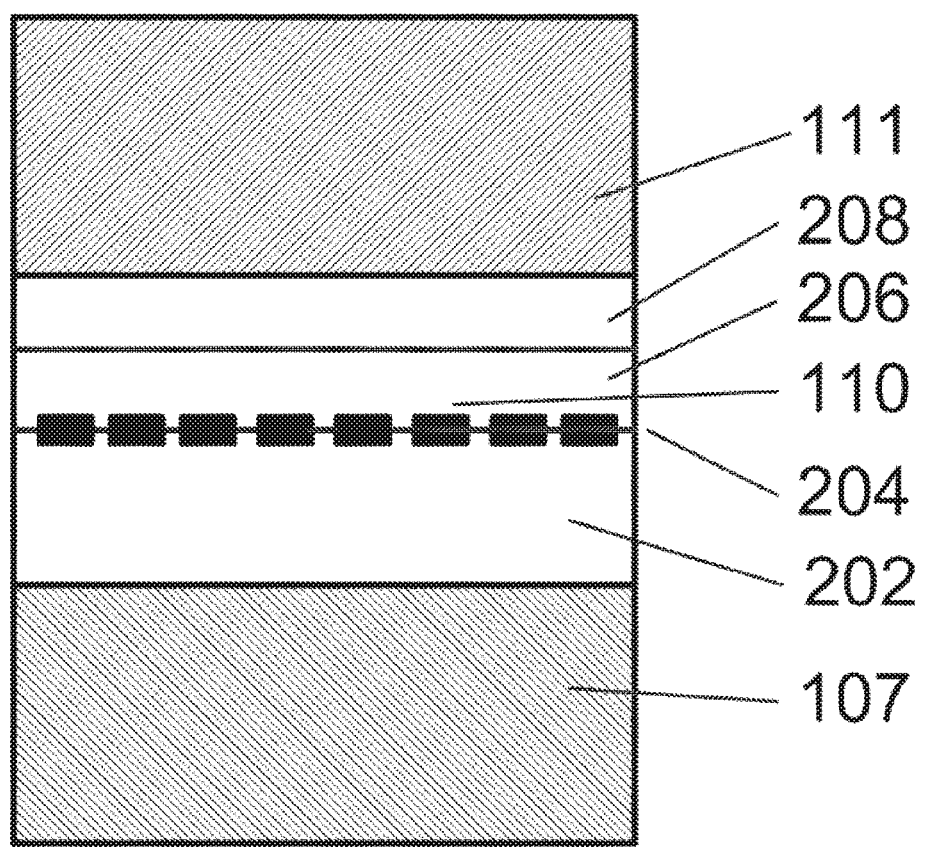
FIG. 5 shows a schematic cross-sectional view of the active region of an embodiment of the present invention; not to scale.

FIG. 5 shows a schematic cross-sectional view of the active region of an embodiment of the present invention; not to scale. The active region (108) comprises four strata (202, 204, 206 and 208) and is preceded by a first spacer layer (107), and followed by a second spacer layer (111).

In this embodiment, the first (107) and second (111) spacer layers comprise aluminium (x) gallium (1-x) arsenide where the ratio of aluminium to gallium forms a composition gradient, and so forms a quantum well. Three strata (202, 206 and 208) of the active region (108) comprise gallium arsenide with suitable properties to allow a further stratum (204) comprising gallium antimonide to form active laser devices (110).

The construction of one exemplary embodiment of the present invention will now be given in detail. This embodiment is engineered and fabricated to have an output wavelength of 1300 nanometres. It will be clear to those skilled in the art how to vary parameters in order to vary this wavelength.

Construction of the device begins with a crystalline solid-state gallium arsenide substrate (104), widely available commercially.

First deposited onto the substrate (104) is a buffer layer (105) of gallium arsenide with thickness around 1 micron (not critical). This is n-type doped (for example with tellurium or silicon) to a level of 2×1018 dopant atoms per cubic centimetre.

Next the first layer (layer "A", black line in FIG. 1) of the first DBR mirror region (106) is deposited, comprising aluminium (0.9) gallium (0.1) arsenide. This is n-type doped (for example with tellurium or silicon) to a level of 2×1018 dopant atoms per cubic centimetre, and has a thickness of 112.2 nanometres.

This is followed by the second layer (layer "B", white line in FIG. 1) of the first DBR mirror region (106), comprising gallium arsenide. This is n-type doped (for example with tellurium or silicon) to a level of 2×1018 dopant atoms per cubic centimetre, and has a thickness of 98.5 nanometres.

The A and B layers are repeated alternately until there are in total 35 instances of the A layer and 34 instances of the B layer, to complete the first mirror region (106). Fewer layers are shown in FIG. 1 to improve clarity.

As shown in FIG. 5, the active region (108) is preceded by a first spacer layer (107) comprising 199.9 nanometres of undoped aluminium (x) gallium (1-x) arsenide, where the aluminium fraction x decreases substantially linearly from an initial value of 0.6 to a final value of 0.3 at the side nearer to the active region.

The active region (108) comprises a first stratum (202) of 10 nanometres of undoped gallium arsenide, followed by a second stratum (204) comprising nominally 2.1 atomic monolayers of undoped gallium antimonide (approximately 0.6 nm), a third stratum (206) of 5 nanometres of "cold capping" undoped gallium arsenide and a fourth stratum (208) of a further 5 nanometres of undoped gallium arsenide.

The active laser devices (110) form in the second stratum (204).

The active region (108) is followed by a second spacer layer (111) comprising 199.9 nanometres of undoped aluminium (x) gallium (1-x) arsenide, where the aluminium fraction x decreases substantially linearly from an initial value of 0.3 at the side nearer to the active region, to a final value of 0.6. Other values for the composition fractions may be used in other embodiments.

Next a first (low refractive index) layer of the second DBR mirror region (112) is deposited, comprising aluminium (0.9) gallium (0.1) arsenide. This is p-type doped (for example with beryllium or carbon) to a level of $2\times 10^{18}$ dopant atoms per cubic centimetre, and has a thickness of 112.2 nanometres.

This is followed by the second (high refractive index) layer (layer "C", white in FIG. 1) of the second DBR mirror region (112), comprising gallium arsenide. This is p-type doped (for example with beryllium or carbon) to a level of $3\times 10^{18}$ dopant atoms per cubic centimetre, and has a thickness of 98.5 nanometres.

This is followed by the third (low refractive index) layer (layer "D", black in FIG. 1) of the second DBR mirror region (112), comprising aluminium (0.9) gallium (0.1) arsenide. This is p-type doped (for example with beryllium or carbon) to a level of $3\times 10^{18}$ dopant atoms per cubic centimetre, and has a thickness of 112.2 nanometres.

The C and D layers are repeated alternately until there are in total 24 instances of the C layer and 24 instances of the D layer. That completes the second mirror region (112). Fewer layers are shown in FIG. 1 to improve clarity.

The exact number of periods (layers) in each DBR mirror region (106, 112) is not critical. However, a structure with too few layers may prevent the laser from reaching the lasing threshold condition, and a structure with too many layers may degrade laser performance through photon absorption. Preferably there are more layers in the first DBR mirror region (106) than in the second (112), in order to avoid emission of light in the wrong direction (i.e., towards the substrate (104)).

The structure is then completed by the addition of a contact layer (116) comprising gallium arsenide p-type doped (for example with beryllium or carbon) to a level of at least $1\times 10^{19}$ dopant atoms per cubic centimetre and 98.5 nanometres in thickness.

In addition to the vertical structures detailed above, VCSELs require lateral confinement of current and lateral optical confinement to operate efficiently. This requirement is well known to those skilled in art and may be achieved by selection of a suitable technique:

One such confinement technique is ion bombardment, by which insulating layers are created at the edges of the part of the device (111, 112 and 114) above the active region (108, 111) by bombarding the device with high energy ions.

Another such confinement technique is the oxidation of gallium aluminium arsenide with an aluminium composition of roughly 98%. In this technique, an additional gallium aluminium arsenide layer is included in the device structure immediately after (above) the active region (108). Edge regions of this layer may be oxidised after growth. The resulting lateral oxide layer is insulating and has a very different refractive index to the aluminium arsenide. This layer provides both electrical and optical confinement.

Devices according to the present invention may be grown by several techniques: Devices according to the present invention may be grown by molecular beam epitaxy ("MBE"). Example MBE growth conditions are given below, detailing temperature and growth rate. Note that these vary in detail from machine to machine as is well known to those skilled in the art. Gallium arsenide (105, 106-B, 112-C, 114, 202, 208): 580° C., 1 monolayer/second (arsenic to gallium ratio of 1.7)

"Cold cap" gallium arsenide (206) 430° C., 1 monolayer/second (arsenic to gallium ratio of 5)

Aluminium gallium arsenide (106-A, 107, 111, 112-D): 600° C., 1 monolayer/second (group five to group three ratio of 2)

Gallium antimonide (204) 490° C., 0.3 monolayers per second (antimony to gallium atomic ratio of 10).

Devices according to the present invention may also be grown by chemical vapour deposition ("CVD") such as metal-organic chemical vapour deposition ("MOCVD") also known as metal-organic vapour phase epitaxy. Growth by MOVCD requires conditions (different to those for MBE), which are well known to those skilled in the art.

While the present invention has been described in generic terms, those skilled in the art will recognise that the present invention is not limited to the cases described, but can be practised with modification and alteration within the scope of the appended claims. The Description and Figures are thus to be regarded as illustrative instead of limiting.

The invention claimed is:

1. A vertical-cavity surface-emitting laser ("VCSEL") comprising at least a substrate, electrical contacts, a first mirror region, a second mirror region and an active region between the mirror regions; where
    the mirror regions comprise distributed Bragg reflectors formed of a plurality of layers;
    laser emission is from at least one gallium arsenide antimonide nanostructure in the active region; and
    each said nanostructure contains more antimony atoms than arsenic atoms,
    wherein each nanostructure comprises a gallium antimonide quantum ring, and each quantum ring is located within a gallium arsenide quantum well.

2. The vertical-cavity surface-emitting laser as in claim 1 where each quantum well is provided by a first additional layer between the active region and the first mirror region and a second additional layer between the active region and the second mirror region.

3. The vertical-cavity surface-emitting laser as in claim 2 where the said additional layers comprise aluminium gallium arsenide.

4. The vertical-cavity surface-emitting laser as in claim 3 where the said additional layers comprise a composition gradient of gallium and aluminium.

5. The vertical-cavity surface-emitting laser as in claim 4 where the composition gradient is substantially linear.

6. The vertical-cavity surface-emitting laser as in claim 4 where within the said additional layers the group III atomic fraction of aluminium increases from a low value at the side nearer to the active region, to a high value at the side further from the active region.

7. The vertical-cavity surface-emitting laser as in claim 6 where the said low value is between 0.25 and 0.35 and the said high value is between 0.55 and 0.65.

8. The vertical-cavity surface-emitting laser as in claim 7 where the said low value is 0.3 and the said high value is 0.6.

9. The vertical-cavity surface-emitting laser as in claim 1 generating laser emission with a wavelength within the range 1260 to 1675 nm.

10. The vertical-cavity surface-emitting laser as in claim 9 operating without the need for active cooling.

\* \* \* \* \*